(12) United States Patent
Rakuljic

(10) Patent No.: US 7,995,630 B2
(45) Date of Patent: Aug. 9, 2011

(54) HIGH PERFORMANCE TUNABLE LASERS UTILIZING OPTICAL PHASE-LOCKED LOOPS

(76) Inventor: George A. Rakuljic, Santa Monica, CA (US)

( * ) Notice: Subject to any disclaimer, the term of this patent is extended or adjusted under 35 U.S.C. 154(b) by 87 days.

(21) Appl. No.: 12/416,150

(22) Filed: Apr. 1, 2009

(65) Prior Publication Data

US 2009/0245306 A1 Oct. 1, 2009

Related U.S. Application Data

(60) Provisional application No. 61/041,572, filed on Apr. 1, 2008.

(51) Int. Cl.
*H01S 3/13* (2006.01)
*H01S 3/00* (2006.01)

(52) U.S. Cl. ........... 372/29.011; 372/29.01; 372/29.016; 372/38.1

(58) Field of Classification Search .... 372/29.01–29.02, 372/29.023, 38.01–38.02
See application file for complete search history.

(56) References Cited

U.S. PATENT DOCUMENTS

| 7,848,370 | B2* | 12/2010 | Kewitsch et al. | 372/29.011 |
|---|---|---|---|---|
| 2003/0091097 | A1* | 5/2003 | Yap et al. | 375/132 |
| 2003/0197917 | A1* | 10/2003 | Yap et al. | 359/330 |
| 2004/0101317 | A1* | 5/2004 | Yap et al. | 398/187 |
| 2006/0239312 | A1* | 10/2006 | Kewitsch et al. | 372/29.023 |
| 2009/0296751 | A1* | 12/2009 | Kewitsch et al. | 372/18 |

* cited by examiner

*Primary Examiner* — Minsun Harvey
*Assistant Examiner* — Phillip Nguyen

(57) ABSTRACT

This invention relates to opto-electronic systems using semiconductor lasers driven by optical phase-locked loops that control the laser's optical phase and frequency. Feedback control provides a means for precise control of optical frequency and phase, including the ability for broadband electronic tunability of optical signals and the cascading of multiple lasers for enhanced tunability and coherent combining for increased output power.

13 Claims, 5 Drawing Sheets

HIGH PERFORMANCE TUNABLE LASERS UTILIZING OPTICAL PHASE-LOCKED LOOPS

REFERENCE TO RELATED APPLICATIONS

This application relies for priority on provisional application 61/041,572 to Rakuljic, filed on Apr. 1, 2008 and entitled "High performance optical phase-locked loops."

FIELD OF THE INVENTION

This invention relates to opto-electronic systems using semiconductor lasers driven by electronic feedback control circuits that dynamically control the laser's optical phase and frequency.

BACKGROUND OF THE INVENTION

Electronic phase-locked loops (PLL) have a wide range of applications in the field of electronics. An introduction to these techniques is presented in F. M. Gardner, Phaselock Techniques, $3^{rd}$ ed. (Wiley, 2005). Phase-locked loops can be extended to the optical domain by use of semiconductor lasers as current-controlled oscillators, thereby realizing an opto-electronic implementation of phase-locked loops, as described by A. Yariv, in "Dynamic analysis of the semiconductor laser as a current-controlled oscillator in the optical phased-lock loop: applications," Optics Letters, vol. 30, pp. 2191-2193, September 2005. The opto-electronic implementation of phase-locked loops is commonly referred to as optical phase-locked loops (OPLLs).

Extremely wide-band optical waveforms and precisely tunable Terahertz signals can be generated over a wide frequency range by using OPLLs to electronic control the frequency and phase of semiconductor lasers (SCLs) including near-visible and near-infrared semiconductor diode lasers and mid-infrared quantum cascade lasers (QCLs). Such electronic control enables a number of applications including coherent power combining (see, for example, N. Satyan, W. Liang, F. Aflatouni, A. Yariv, A. Kewitsch, G. Rakuljic, and H. Hashemi, "Phase-controlled apertures using heterodyne optical phase-locked loops," IEEE Photonics Technology Letters, vol. 20, pp. 897-899, May-June 2008) and U.S. Patent Application 2006/0239312 to Kewitsch et al. Moreover, techniques to stabilize the frequency of semiconductor lasers are disclosed in U.S. Pat. No. 5,717,708 to Mells.

Semiconductor laser-based OPLLs are promising candidates for a number of applications in the fields of frequency modulated continuous wave (FMCW) laser radar, arbitrary broadband waveform generation, Terahertz signal generation, and coherent optical communications. Unique characteristics of semiconductor lasers include their large tuning responsive to electrical drive currents (1-10 GHz/mA) and their wide tuning ranges of up to 1 THz or more.

SUMMARY OF THE INVENTION

In this invention, we disclose a number of devices and systems based on the dynamic electronic phase and frequency control of a semiconductor laser in an optical phase-locked loop. In a first example, extremely wideband frequency chirped optical waveforms are generated by the transfer of a chirped RF waveform to the optical domain using OPLLs. In an alternate example, a number N semiconductor laser sources and PLL control circuits are cascaded, such that the frequency chirp of the RF waveform is scaled-up by a factor of N while preserving the fidelity or linearity of the waveform.

Techniques to generate precisely and continuously tunable Terahertz signals over a very wide frequency range using two semiconductor lasers locked to different frequencies of a discrete, tunable optical frequency comb are also disclosed.

In an alternate example, we disclose the use of OPLLs as coherent demodulators for clock recovery in coherent optical demodulation systems.

In a final example, we disclose techniques to coherently combine a multiplicity of lasers by electronically phase-locked the lasers to one another. Phase-locking over a wide bandwidth is achieved by homodyne, heterodyne or sideband locking, and enhanced bandwidth and low noise locking performance is achieved by incorporating external optical phase or frequency modulators.

DETAILED DESCRIPTION OF THE INVENTION

Figure 1:
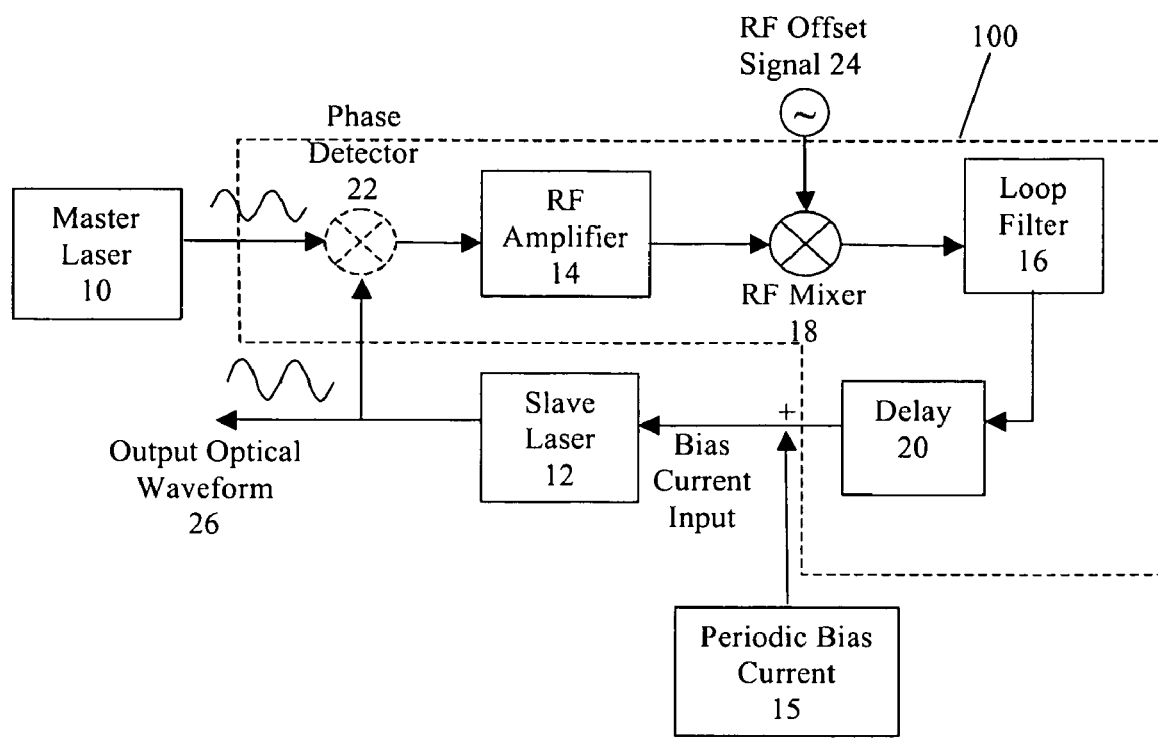
FIG. 1 illustrates a block diagram of a heterodyne optical phase-locked loop with wavelength agile RF offset signal for tunability.

In this invention, we disclose opto-electronic systems consisting of OPLLs and frequency agile semiconductor lasers designed to provide broadband tunable optical radiation. Extremely wideband frequency-chirped optical waveforms 26 are generated by the transfer of a chirped RF offset signal 24 to the optical domain using the stand-alone OPLL unit 100 (FIG. 1). This dynamic, electronically tunable semiconductor laser system is comprised of a master laser 10 with an optical output at a constant frequency and one or more frequency variable semiconductor slave lasers 12. Each slave laser includes an optical output and a bias current input, wherein the output frequency of each said slave laser is responsive to the bias current input. The system further includes one or more electronic RF offset signal sources 24 of variable frequency and one or more error feedback circuits for generating a bias current signal. Each error feedback circuit 100 is coupled to the bias current input of a different slave laser. The error feedback circuits are responsive to the electronic beat signals and include an optical mixer 22 responsive to the optical outputs of the master laser and a particular slave laser. The optical mixer produces an RF beat signal in response to the optical beat signal. A downstream electronic mixer 18 is utilized to shift the frequency of RF beat signal to a lower frequency (e.g., a baseband signal) suitable for insertion into the bias current input. Upon activation of the electronic locking process, the optical frequency of the slave laser maintains a modulation component responsive to the RF offset signal for the duration of the locking process.

The slave SCL 12 acts as a local oscillator (LO) laser that is locked to a master laser 10 at a frequency and phase offset given by an RF offset signal 24 whose frequency is changeable over time or "chirped", by beating or interfering the optical outputs of the master and slave lasers on a high speed photodiode or optical mixer 22 functioning as a sinusoidal phase detector. The current injected into the semiconductor slave laser 12 consists of a high bandwidth modulation current component output by the loop filter 16 of the phase-locked loop 100 summed with a predetermined and preprogrammed periodic current waveform produced by an electronic signal generator 15. The use of the periodic current waveform enables gross wavelength tuning to be accomplished in an open-loop fashion, whereby activating the OPLL feedback loop enhances the linearity and bandwidth of the generated optical waveform 16.

Representing this process mathematically, for an OPLL loop in lock, the frequency and phase of the slave laser 12, $\omega_s$ and $\phi_s$ respectively, are given by:

$$\omega_s = \omega_m + \omega_{os} \quad \text{(Eq. 1)}$$

$$\phi_s = \frac{G_{op}}{1 + G_{op}}(\phi_m + \phi_{os}) + \frac{1}{1 + G_{op}}\phi_{s,fr}, \quad \text{(Eq. 2)}$$

where $G_{op}$ is the total open-loop gain of the feedback circuit 100, equal to the product of the gains of the photodetector 22, the loop filter 16, delay 20, and the semiconductor slave laser 12. $\omega_m$ and $\phi_m$ are the frequency and phase of the master laser 10, and $\omega_{os}$ and $\phi_{os}$ are the frequency and phase of the RF offset signal 24. $\phi_{s,fr}$ refers to the free-running phase of the slave laser 12. For frequencies much smaller than the loop bandwidth, $G_{op} \gg 1$, Eq. 2 reduces to:

$$\phi_s = \phi_m + \phi_{os}. \quad \text{(Eq. 3)}$$

The relation between the power spectral density of the phase noise of the locked slave laser 12 and those of the master laser 10 and the free running slave laser is derived from Eq. 2 by ignoring the phase noise of the RF offset signal 24:

$$S_\phi^s(f) = \left|\frac{G_{op}}{1 + G_{op}}\right|^2 S_\phi^m(f) + \left|\frac{1}{1 + G_{op}}\right|^2 S_\phi^{s,fr}(f). \quad \text{(Eq. 4)}$$

The power spectral density of the phase-locked semiconductor slave laser 12 follows that of the master laser 10 for frequencies less than the loop bandwidth and retains the characteristics of the free running semiconductor slave laser 12 at those frequencies greater the loop bandwidth. From Eq. 1 and Eq. 3, the frequency and phase of the locked slave laser 12 can be seen to be in direct proportion to the frequency and phase of the RF offset signal 24. In particular, the frequency of the slave laser, $\omega_s$ can be changed by varying $\omega_{os}$ in Eq. 1. The wide tuning range potential of the semiconductor slave laser 12 enables the generation of broadband frequency-chirped optical waveforms by the transfer of an RF waveform to the optical domain while preserving its fidelity. While this technique can be used to impress any arbitrary frequency chirp from an RF waveform 24 onto the optical wave 26, the case of a linear frequency-chirp is of particular interest for frequency modulated continuous wave (FMCW) laser radar applications. If a linear frequency chirp $\omega_{os} = \beta t$ is applied as the offset signal 24 to the feedback loop 100, the frequency of the optical signal is given by $\omega_s = \omega_m + \beta t$. Note that Eq. (1) is only valid when the slave laser 12 is in phase-lock. Moreover, the free running frequency difference is defined as:

$$\Delta\omega = \omega_m + \omega_{os} - \omega_{s,fr}, \quad \text{(Eq. 5)}$$

where $\omega_{s,fr}$ is the free-running frequency of the slave laser 12, which is set by the bias current injected into the semiconductor slave laser's gain section. This bias current can be held constant or follow a predetermined periodic waveform generated by source 15.

The holding range (maximum value of $\Delta\omega$ for which the loop stays in lock) of an OPLL is equal to the total DC loop gain, and is limited by the loop bandwidth for first order loops. The loop bandwidth for OPLLs with single section SCLs is limited to about 1-5 MHz by their non-uniform frequency modulation properties at low frequencies [P. Correc, O. Girard, and I. F. Defaria, "On the Thermal Contribution to the FM Response of DFB Lasers—Theory and Experiment," IEEE Journal of Quantum Electronics, vol. 30, pp. 2485-2490, 1994], which in turn leads to a limited phase-lock holding range of <10 MHz. By the use of an active electronics loop filter 16, the holding range may be increased by more than two orders of magnitude, up to +/−3 GHz.

Alternatively, a high frequency optical phase or frequency modulator 28 may be placed in-line with the output of laser 12 to enable further control over the phase and frequency of the optical wave within spectral regions for which the SCL does not FM modulate in a well-behaved fashion. For example, a fiber coupled, electro-optic phase modulator 28 may provide a response from just below the thermal crossover frequency (e.g., 1 MHz) to in excess of 10's of GHz, thereby eliminating the dynamic instability that would otherwise occur for a typical single section laser driven in excess of the thermal crossover frequency.

Since the holding range of the optical phase-locked loop 100 imposes a limitation on the range of frequencies of the chirped optical waveform 26, it is desirable to apply the previous techniques of using a periodically varied bias current from 15 to maximize the achievable tuning bandwidth. If the slave laser 12 bias current is held constant, i.e. if $\omega_{s,fr}$ is held fixed in (Eq. 5), the bound on $\Delta\omega$ imposes a limitation on the allowed range of frequencies over which $\omega_{os}$ can be tuned. This limitation has been overcome by using the knowledge of the frequency chirp of the RF offset signal 24 to vary the bias current of the semiconductor slave laser 12 as produced by source 15, which is summed to the OPLL modulation current component provided at the output of filter 16.

If the net bias current into the semiconductor laser is changed so that its free-running frequency nominally follows that of the RF offset waveform, i.e.

$$\omega_{s,fr} = \omega_m + \omega_{os} + \delta, \quad \text{(Eq. 6)}$$

where $\delta$ accounts for the inaccuracy in the current tuning of the SCL (e.g. due to thermal effects), then the free running frequency difference in (Eq. 5) is given by $\Delta\omega = \delta$ and is much smaller than the holding range. As a direct consequence of summing the OPLL modulation current output with the predetermined bias current waveform, the holding range of the OPLL 100 imposes no limitation on the range of the frequency chirp.

Example 1

Wideband Frequency Chirp Using Cascaded OPLLS

A further limitation to the range of the frequency chirp is imposed by the bandwidth of the RF electronic components used in the loop, such as the detector 22, which is typically <10 GHz. This limitation can be overcome by cascading a number of semiconductor lasers 12 and OPLLs 100, each locked to the previous OPLL of the series cascade at a particular frequency offset within the limited bandwidth of the photodetector 22.

Figure 2:
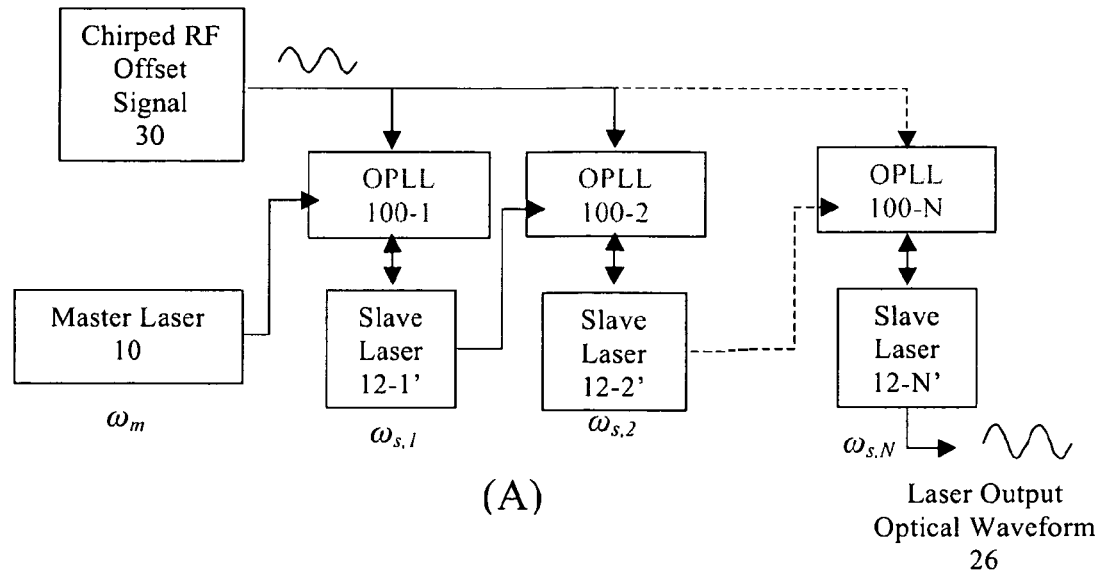
FIG. 2 schematically illustrates (a) the cascaded system of N lasers for the generation of wide bandwidth chirped optical waveforms, (b) the frequency spectra of individual lasers when locked, and (c) the variation of the frequency of the RF offset signal and the $N^{th}$ semiconductor laser over one period, for a linearly chirped RF signal.
Figure 2:
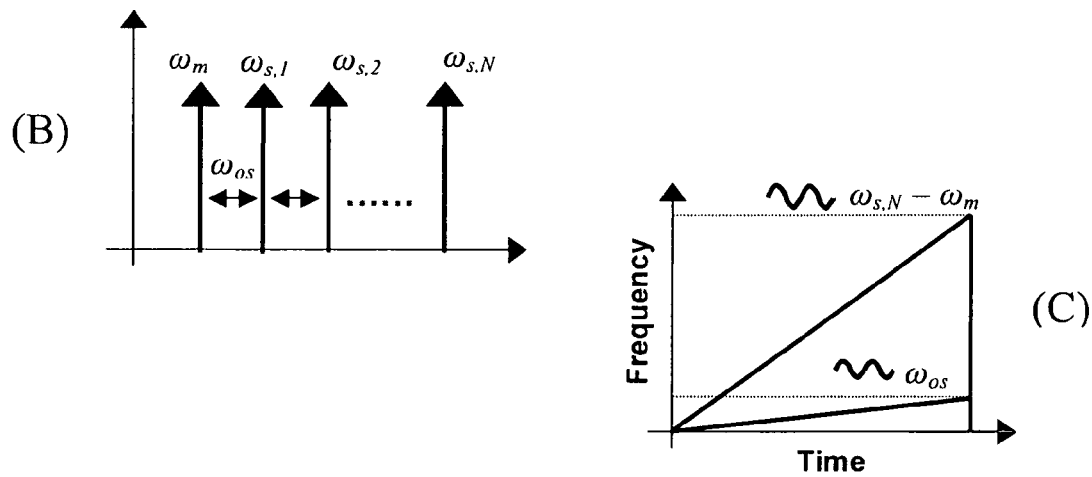

In a cascaded heterodyne OPLL system with N semiconductor slave lasers 12-1, . . . 12-N, (FIG. 2-A) and one master laser 10, the frequency chirp of the RF waveform 24 is scaled-up by a factor of N while preserving the fidelity or linearity of the waveform at the laser output 26. The array of semiconductor slave lasers 12-1, . . . 12-N is locked in cascade, where each slave laser 12-$i$ is locked to the previous slave laser 12-($i$−1) in a heterodyne OPLL. A common chirped RF signal 24 is used as the offset signal in each loop 100-1, . . . 100-N, so that the frequencies of the locked lasers are equally spaced as shown in FIG. 2-B. The frequencies of the lasers are then given by:

$$\bullet_{s,k} = \omega_m + k\omega_{os}, k=1 \ldots N. \quad (Eq.\ 7)$$

The frequency excursion of the $N^{th}$ slave laser 12-N is therefore given by N times the frequency chirp of the RF waveform 24. The chirped waveform from the RF offset signal 24 is thereby transferred to the $N^{th}$ slave laser 12-N, scaling-up the frequency chirp by a factor of N while preserving the fidelity of the waveform. This is depicted in FIG. 2-C for a linearly chirped periodic signal. The high tuning range and fast response of the SCL allows for the generation of frequency ramps of >$10^{14}$ Hz/s and frequency chirps of 1 THz or more.

The highly linear, broadband chirped optical waveform is an ideal source for FMCW laser radar in terms of improving the radar range and resolution. FIG. 2-B illustrates the optical frequency components on a graph of the optical frequency spectrum, and FIG. 2-C illustrates the temporal characteristics for the particular case of linear wavelength chirp.

Example 2

Terahertz Waveform Generation Using OPLLS and Frequency Combs

Figure 3:
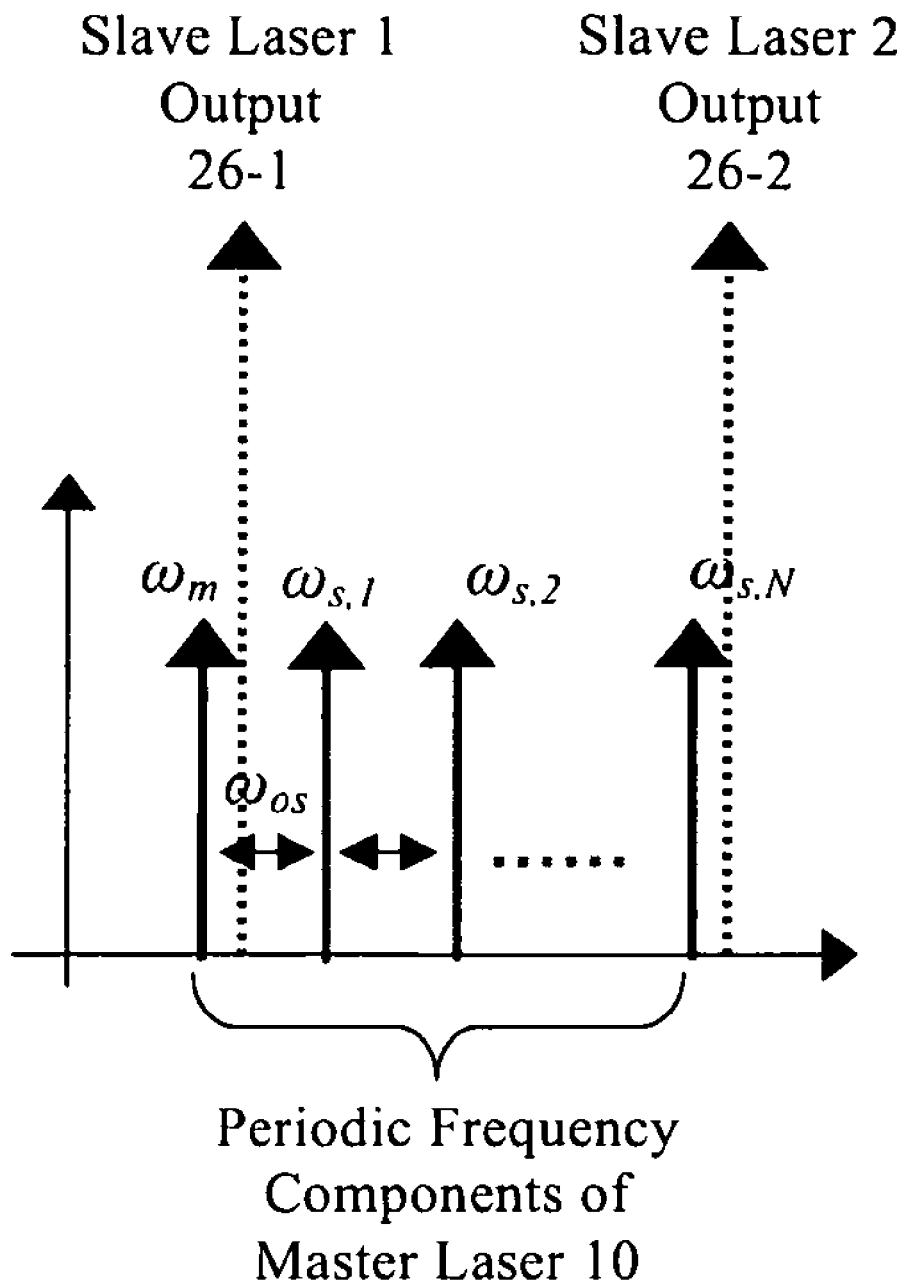
FIG. 3 illustrates the output spectrum of the multi-frequency master laser superimposed with the spectrum of two slave lasers.

In a further example, we disclose an approach to generate wide-band (potentially Terahertz), frequency-chirped optical waveforms 26 using optical frequency combs (e.g. mode-locked lasers) for the master laser 10 serving as the OPLL reference laser. The master laser frequency comb consists of a number of discrete spectral components (FIG. 3), equally separated by a frequency $\omega_0$, across the ultraviolet, visible and/or infrared optical spectra. The master laser can be a semiconductor, solid state, or gas laser, for example. In a particular example, a mode-locked solid-state laser with a multiplicity of spectral components spanning the range of up to 100s of nm, and a center wavelength of about 1000 nm and mode spacings of the order of a few GHz, is utilized for master laser 10. When a semiconductor slave laser 12 is locked to one of the modes of a mode-locked master laser 10, its frequency is given by (from Eq. (1)), $$\omega_s = \omega_{mode} + \omega_{os}, \quad (Eq.\ 8)$$

where $\omega_{mode}$ is the frequency of the spectral component to which the semiconductor slave laser 12 is locked. By choosing an appropriate spectral component frequency $\omega_{mode}$ and using the RF offset signal to tune over the mode spacing $\omega_0$, an optical waveform 26 with an arbitrary frequency chirp within the tuning range of the SCL can be generated.

Semiconductor lasers offer the advantages of high power, low cost and fast tuning capability, which make them attractive choices for the generation of continuously tunable broadband Terahertz sources. As illustrated by the frequency spectrum of FIG. 3, the optical outputs of two semiconductor slave lasers are locked to two different and space apart modes of a mode-locked master laser 10 with different RF offset frequencies, so that their frequencies are (from Eq. (1)):

$$\omega_{s,1} = \omega_{mode,1} + \omega_{os,1}$$

$$\omega_{s,2} = \omega_{mode,2} + \omega_{os,2} \quad (Eq.\ 9)$$

The beat signal between the two locked slave lasers is at the optical frequency:

$$\omega_b = (\omega_{mode,2} - \omega_{mode,1}) + (\omega_{os,2} - \omega_{os,1}) \quad (Eq.\ 10)$$

By choosing the modes $\omega_{mode,1}$ and $\omega_{mode,2}$ appropriately, and continuously varying one (or both) of the RF offset signals 24, we generate a continuously tunable wideband Terahertz signal. The linewidth of the Terahertz signal is given by the linewidth of each mode of the mode-locked master laser 10 (from Eq. (4)) and can be very small if narrow linewidth mode-locked lasers are used. The advantage of locking to different spectral components of the mode-locked laser is the reduction in necessary bandwidth of the phase detector 22 to detect the beat note between the two slave lasers 12 and the master laster 10.

Similar to the cascaded approach of Example 1, the tuning range can be multiplied by a factor of N. However, in this Example 2, tuning range multiplication by N is accomplished by homodyne or close-in heterodyne locking two slave lasers to different spectral components of the mode locked laser, the spectral components separated by a factor of N times the master laser's mode spacing, without requiring a commensurate increase in photodiode 22 bandwidth. This has the advantage of reducing the number of opto-electronic devices within the system, as well as potentially reducing the phase-noise of the output waveform 26 by eliminating an accumulation of phase-noise resulting from the locking a cascade of lasers in a series fashion.

Example 3

Synthesis of Arbitrary Waveforms Using OPLLS

In an alternate example of the invention, a multi-wavelength laser system is comprised of a multiplicity of semiconductor slave lasers 12-$n'$ as in FIG. 2, each locked to a different optical frequency and phase and the optical outputs of slave lasers combined into a single output to generate an arbitrary optical waveform. Consider an arbitrary periodic optical signal 26 with a fundamental frequency $\omega$ that modulates the optical carrier at $\omega_c$. This signal can be decomposed mathematically into a series of Fourier components, each component being an optical field with particular amplitude and phase:

$$E(t) = \sum_{m=-\infty}^{\infty} |a_m| e^{j(m\omega t + \theta_m)} e^{j\omega_c t}. \quad (Eq.\ 11)$$

Signal 26 can then be generated by combining individual spectral components at the frequencies $\omega_c + m\Phi$ with the proper amplitudes and phases as given by Eq. 11. The optical phase of each of these components is controlled by changing the phase of the RF offset signal 24 (Eq. 3), thereby eliminating the need for modulators.

Moreover, arbitrary amplitude modulation may be achieved using variable attenuators. Based on this technique, it is possible to directly synthesize arbitrary optical waveforms whose periodicity can be changed by varying the frequency synthesize arbitrary optical waveforms whose periodicity can be changed by varying the frequency $\omega_{os}$ of the RF offset signal 24. This approach is fundamentally different from that based on a mode-locked laser master laser 10, because in the former case, the repetition frequency of the synthesized optical waveform 26 is equal to the frequency of the RF offset signal 24 and can be electronically tuned over a wide frequency range and in a continuous fashion.

In the prior art, such arbitrary waveform generation is achieved by spatially separating and wavelength demultiplexing the equally spaced spectral components of a frequency comb (e.g. a mode-locked laser) using a diffraction grating or arrayed waveguide gratings. This is followed by the independent manipulation of the amplitude and phase of each spectral component using spatial light modulators and their subsequent combination [Zhi Jiang, D. E. Leaird, A. M. Weiner, "Optical arbitrary waveform generation and characterization using spectral line-by-line control," Journal of Lightwave Technology, vol. 24, pp. 2487-2494, July 2006].

Example 4

OPLLs for Coherent Optical Demodulation

In a further example of this invention, semiconductor laser-based OPLLs can be incorporated into coherent optical communication systems and thereby enable higher data rates, improved spectral efficiencies and relaxed requirements for transmitted signal power per bit of transmitted data. Coherent communication systems utilize the phase information of an optical signal (e.g. multiple level Phase Shift Keying) as opposed to (or in addition to) the intensity, thereby encoding a larger number of symbols per bit, and increasing the data rate without increasing the modulation frequency. With semiconductor lasers, the use of OPLLs for coherent clock recovery and demodulation is feasible.

Figure 4:
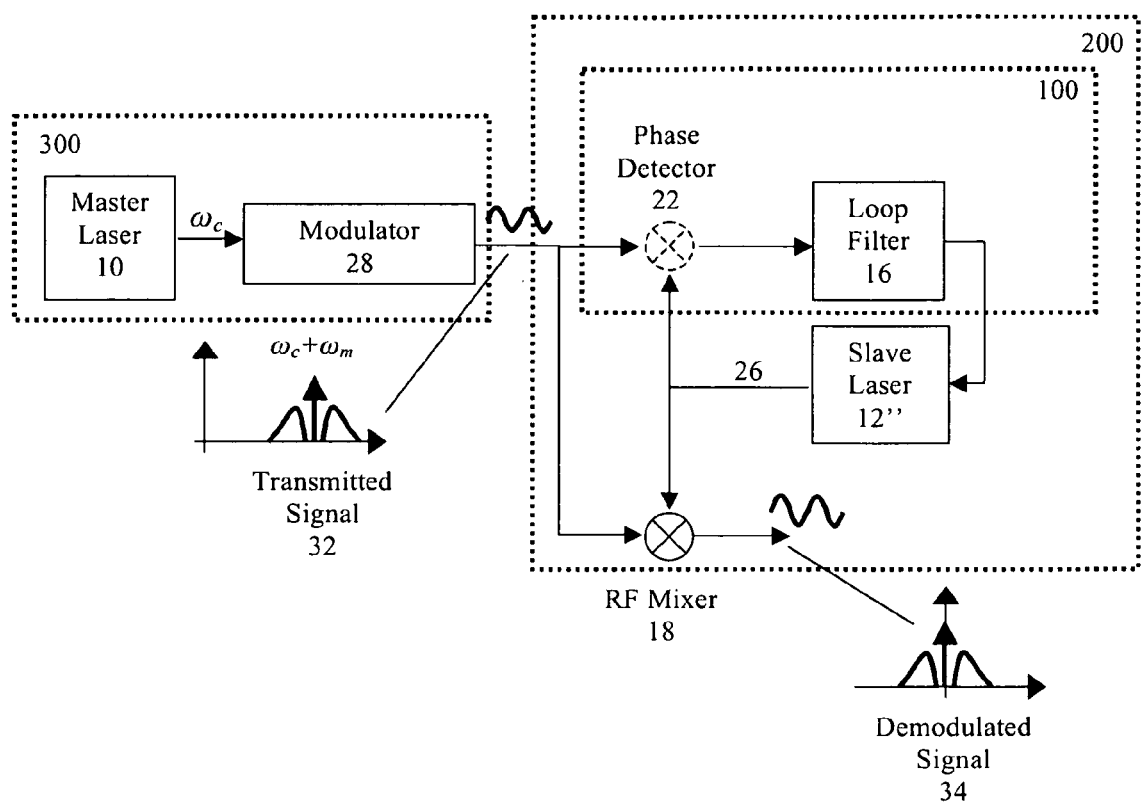
FIG. 4 illustrates a block diagram of a coherent optical communications receiver using an OPLL.

A coherent receiver using an OPLL is shown in FIG. 4. The slave laser 12" (i.e., local oscillator (LO)) at the receiver 200 is locked to the carrier frequency of the signal wave. The low pass loop filter 16 in the feedback loop passes the low frequency phase noise. This results in the LO slave laser 12" acquiring an average frequency equal to the carrier frequency of the transmitted signal wave 32, and the near total suppression of the LO phase noise. The beating of the LO with the signal wave thus results in the phase demodulation of the signal, producing demodulated baseband signal 34. This further eliminates the coherent transmitter 300 phase noise and the relative frequency drifts of the master laser 10 and slave laser 12".

Example 5

Phase-Locked and Coherently Combined High Power Mid-IR Lasers

In an alternative example, we disclose a technique to increase the optical power of semiconductor laser-based systems emitting in the mid-infrared by coherently beam combining a multiplicity of separate and independent slave lasers 12'''. In particular, mid-infrared lasers, include quantum cascade lasers (QCLs) emitting 10 to 100's of mW per laser in the wavelength range of 3 to 30 microns, are phase-locked to a common master laser 10 by current modulating the QCL. In contrast to Example 3, all slave lasers 12-$n'''$ share a common RF offset frequency relative to the same master laser 10. The slave lasers exhibit a frequency tuning response as a result of the Joule heating produced by changes in the injected drive current. This tuning response is utilized to electronically phase-lock one or more lasers to a reference laser and to control their optical phases electronically so that their outputs can be coherently added.

Figure 5:
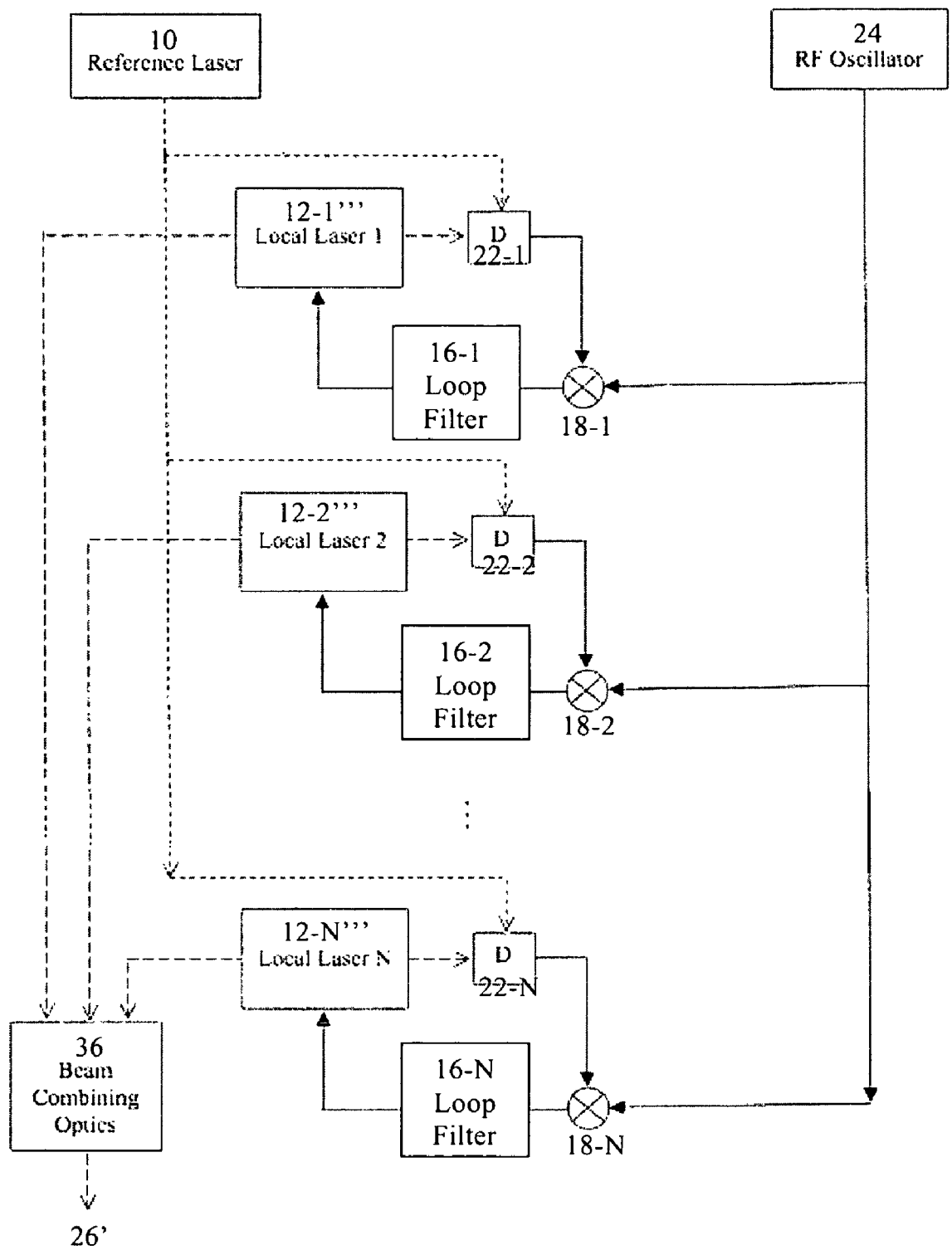
FIG. 5 illustrates a block diagram of the system for coherent laser beam combination for power multiplication.

FIG. 5 illustrates an example in which N slave lasers 12''' are electronically controlled by such means to emit mutually coherent radiation. Each phase-locked loop 100 independently controls the optical frequency and phase of its associated laser 12''' by detecting the beat note formed on its photodetector 22 and down-converting it to a baseband electronic signal using a mixer 18, the output of which is processed by the feedback circuit to produce a modulation component to the slave laser's drive current. In general, these lasers 12''' still exhibit a phase noise representative of the master laser 10. However, by virtue of the coherence between locked slave lasers, their optical frequency and phase deviations of the N lasers 12''' are all identical. Therefore, by directing the outputs of these lasers into a beam combining system 36, the individual beams are merged into a composite beam 26' exhibiting the characteristics of a single, higher power beam.

The multiplication of optical power enables the use of relatively low power QCL slave lasers 12''' in systems requiring more than 1 W, for example, by combining eight or sixteen lower power lasers, for example. This coherently combined mid-infrared laser system is of value in applications such as remote sensing and standoff detection of chemical and biological agents.

In summary, phase-locked lasers exhibiting enhanced tuning, bandwidth and optical power characteristics are disclosed. Examples of the use of this technique to rapid wavelength-tuned and power combined semiconductor lasers have been disclosed. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of generating a selectively phase and frequency controlled laser output in a combination including a master laser of fixed frequency and at least one semiconductor slave laser of variable frequency having a current bias control for variation of its output frequency, comprising the steps of:
    mixing the output of at the least one slave laser with the output of the master laser to generate an optical beat signal;
    generating an RF offset chirp signal of frequency variable at a selected rate;
    mixing the optical beat signal with the RF offset chirp signal to generate an RF beat signal;
    filtering the RF beat signal, to provide a high modulation current component, and
    controlling the slave laser output by varying the current bias using the filtered RF beat signal.

2. The method as set forth in claim 1 above where the combination includes a number of slave lasers and the method further includes the steps of combining the cascaded outputs of the series of slave lasers after optical and frequency mixing referenced to the master laser to provide selected frequency offsets between successive slave lasers.

3. The method as set forth in claim 2 above, wherein the step of combining the outputs includes generating a different offset chirp signal for each different slave laser to provide a multiplicity of outputs at different wavelengths.

4. The method as set forth in claim 2 above, wherein the offset chirp signals are selected to lock the slave lasers in frequency and phase to provide coherent outputs from multiple sources.

5. A dynamic electronically tunable semiconductor laser system comprising:
   a master laser emitting at a constant frequency;
   at least one semiconductor slave laser having a bias current input and emitting at an output frequency responsive to the bias current;
   a source of a chirped RF offset signal of variable frequency, and
   at least one error feedback circuit providing a bias current input to the slave laser, the error feedback circuit including an optical phase lock loop and receiving signals from the maser laser, slave laser, and the chirped RF offset signal, the feedback circuit further including an optical mixer providing an electronic beat signal output responsive to the master laser and slave laser emissions, and an RF mixer responsive to the electronic beat signal and the chirped RF offset signal and generating a bias current applied to the bias current input of the slave laser.

6. A system as set forth in claim 5 above, wherein the system further includes, in the error feedback circuit, a filter receiving the electronic beat signal and providing a high bandwidth modulation current component output, and a signal generator introducing a predetermined periodic current waveform into the electronic beat signal applied to the slave laser bias current input.

7. A system as set forth in claim 5 above, wherein the system further includes an RF amplifier in the error feedback circuit between the first optical mixer and the RF mixer, and wherein the error feedback circuit includes a delay circuit before the bias current input to the slave laser.

8. A system as set forth in claim 5 above, wherein the system further comprises a number of slave lasers, a common source of chirped RF offset signal and a number of error feedback circuits, each coupled to a different slave laser, and each receiving outputs from the master laser and the common source of chirped RF offset signal, the slave lasers and error feedback circuits being successively cascaded with each locked to the prior slave laser in the sequence in a heterodyne optical phase locked loop.

9. A system as set forth in claim 5 above, wherein the system further includes a modulator coupling the output of the master laser to the optical mixer circuit for generating an optical beat signal from the optical mixer.

10. A system as set forth in claim 5 above, wherein the system further comprises a number of quantum cascade slave lasers operating in the mid-IR range, said slave lasers each being locked to the master laser and the chirped RF offset source, the slave lasers providing mutually coherent radiation and the system further including a beam combining system receiving at least the substantial majority of outputs from the slave lasers.

11. A system for integral multiplication of the bandwidth of frequency tenability of a semiconductor laser and slave lasers with an RF input and optical output, by a factor of N, comprising:
   a plurality N of optical phase-locked loops, each having optical and RF inputs and an RF output;
   a chirped RF electrical signal source coupled to the RF inputs of each of the plurality of N optical phase-locked loops and having a selected frequency deviation;
   a common master laser coupled to the optical input of a first optical phase-locked loop;
   the RF output of the first optical phase-locked loop being coupled to the RF input of the first slave laser;
   the optical output of the first slave laser being coupled to the optical input of the second optical phase-locked loop;
   the optical outputs of successive slave lasers each being coupled to the optical input of the next optical phase-locked loop;
   the cascaded couplings being repeated for all N slave lasers and N optical phase-locked loops, such that the Nth slave laser emits an output optical waveform whose optical frequency deviation is N times larger than the frequency deviation of the chirped RF electrical signal.

12. A system in accordance with claim 11, wherein the frequency deviation of the RF electrical signal is in excess of 1 GHz and the frequency deviation of the output optical waveform is in excess of 10 GHz.

13. A wavelength agile laser system comprised of a semiconductor laser based optical phase-locked loop with enhanced linear tuning characteristics, comprised of:
   a semiconductor slave laser with at least one gain section, the emission frequency of slave laser being responsive to changes in the currents injected into the gain section;
   a common master laser emitting at a constant frequency;
   a common electronic offset signal source of variable frequency;
   an electronic feedback circuit producing a laser modulation current;
   a programmable source generating a periodic laser bias current waveform, the time variation of the waveform selected to provide a nominally linear tuning characteristic of the slave laser, and wherein the optical frequency of the semiconductor slave laser exhibits enhanced linear tuning characteristics by adding the laser modulation current and the fixed periodic current waveform and injecting the combined current into the semiconductor laser gain section.

\* \* \* \* \*